United States Patent [19]

Muraki

[11] Patent Number: 5,189,494
[45] Date of Patent: Feb. 23, 1993

[54] POSITION DETECTING METHOD AND APPARATUS

[76] Inventor: Masato Muraki, c/o Kosugi Jigyosho, Canon Kabushiki Kaisha, 53 Imaikamicho, Nakahara-ku, Kawasaki-shi, Kanagawa-ken, Japan

[21] Appl. No.: 817,969

[22] Filed: Jan. 8, 1992

Related U.S. Application Data

[63] Continuation of Ser. No. 742,726, Aug. 6, 1991, abandoned, which is a continuation of Ser. No. 432,843, Nov. 7, 1989, abandoned.

[30] Foreign Application Priority Data

Nov. 7, 1988 [JP] Japan ............................. 63-280690

[51] Int. Cl.$^5$ .............................................. G01B 11/00
[52] U.S. Cl. ..................................... 356/401; 356/374; 356/375; 250/237 G; 250/548
[58] Field of Search ................. 356/374, 375, 401; 250/237 G, 548, 363

[56] References Cited

U.S. PATENT DOCUMENTS

| | | | |
|---|---|---|---|
| 4,251,160 | 2/1981 | Bouwhuis et al. | 356/401 |
| 4,779,001 | 10/1988 | Makosch | 356/548 |
| 4,814,829 | 3/1989 | Kosugi et al. | 355/43 |
| 4,902,133 | 2/1990 | Tojo et al. | 356/356 |

FOREIGN PATENT DOCUMENTS

| | | | |
|---|---|---|---|
| 0241919 | 10/1986 | Japan | 356/374 |
| WO86/01931 | 3/1986 | PCT Int'l Appl. | 356/401 |
| 2183364 | 6/1987 | United Kingdom | 356/374 |

*Primary Examiner*—F. L. Evans

[57] ABSTRACT

A position detecting method and apparatus for detecting the relative position of a particular grating pattern with respect to a predetermined reference grating pattern, includes a signal forming step for forming first and second signals corresponding to moire fringes provided or to be provided by the patterns, the first and second signals having phases shiftable in opposite directions in accordance with the position of the particular grating pattern; and a position detecting step for detecting the position of the particular grating pattern on the basis of any difference in phase between the first and second signals.

51 Claims, 4 Drawing Sheets

POSITION DETECTING METHOD AND APPARATUS

This application is a continuation of application Ser. No. 07/742,726 filed Aug. 6, 1991, now abandoned, which was a continuation of application Ser. No. 07/432,843 filed Nov. 7, 1989, now abandoned.

FIELD OF THE INVENTION AND RELATED ART

This invention relates to a position detecting method and apparatus. More particularly, the invention is concerned with a position detecting method and apparatus, usable in an exposure apparatus for use in the manufacture of semiconductor microcircuit devices such as ICs, LSIs and the like.

As an example of a position detecting method adopted in this type of exposure apparatus for detecting any relative positional deviation between a mask and a wafer, alignment marks are formed on the mask and the wafer and the images of these alignment marks are observed by using an image pickup device such as a TV camera, and the positional relationship between the images of these marks as formed on the image pickup surface of the pickup device is detected by processing a video signal outputted from the pickup device.

In this type of detecting method wherein the positional relationship between the images of the marks should be detected directly, for enhancement of resolution in regard to the positional error detection it is necessary to use a larger projection magnification in regard to the projection of the image of each mark or it is necessary to use an image pickup surface having picture elements of smaller pitch. However, the enlargement of the projection magnification or reduction in pitch of the picture elements necessarily results in reduction in intensity of light to be received by the pickup device. Therefore, there is a disadvantage of reduction in signal-to-noise ratio of the video signal or decrease in precision of the positional error detection.

SUMMARY OF THE INVENTION

It is accordingly an object of the present invention to provide a position detecting method and apparatus by which the resolution in regard to the positional error detection can be enhanced without decreasing the precision of positional error detection.

In accordance with an aspect of the present invention, to achieve this object, there is provided a position detecting method for detecting the relative position of a particular grating pattern with respect to a predetermined reference grating pattern, the method comprising a signal forming step for forming first and second signals corresponding to moire fringes provided or to be provided by the patterns, the first and second signals having phases shiftable in opposite directions in accordance with the position of the particular grating pattern; and a position detecting step for detecting the position of the particular grating pattern on the basis of any difference in phase between the first and second signals.

In accordance with another aspect of the present invention, there is provided a position detecting method for detecting the relative position of a particular grating pattern with respect to a predetermined reference grating pattern, the method comprising a preparation step for preparing first and second grating patterns whose images, when formed, have different spatial frequencies with respect to a predetermined direction, the first and second grating patterns functioning as the reference grating pattern; a first signal forming step for forming a first signal corresponding to a first moire fringe provided or to be provided by images of the particular grating pattern and the first grating pattern, the first signal having a phase shiftable in a first direction in accordance with the position of the particular grating pattern; a second signal forming step for forming a second signal corresponding to a second moire fringe provided or to be provided by images of the particular grating pattern and the second grating pattern, said second signal having a phase shiftable in a second direction opposite to the first direction in accordance with the position of the particular grating pattern; and a position detecting step for detecting the position of the particular pattern on the basis of any difference in phase between the first and second signals.

In accordance with a further aspect of the present invention, there is provided a position detecting device for detecting the relative position of a particular grating pattern with respect to a predetermined reference grating pattern, device comprising image forming means for forming images of the patterns; and position detecting means for forming first and second signals corresponding to moire fringes provided or to be provided by the images of the patterns, the first and second signals having phases shiftable in opposite directions in accordance with the position of the particular grating pattern, said position detecting means detecting the position of the particular grating pattern on the basis of any difference in phase between the first and second signals.

In one preferred form of the present invention, the first and second signals have substantially the same parameters such as amplitude, period and the quantity of phase shift, except for the direction of phase shift. The setting of the particular grating pattern and the reference grating pattern and the execution of signal formation as well as the structure of the detecting means, are all adapted to provide such first and second signals as above. Also, the grating elements of each grating pattern are formed at a predetermined regular pitch.

In another preferred form of the present invention, the reference grating pattern is provided by first and second grating patterns. The first and second grating patterns are set so that, in respect to a predetermined direction, they have different grating pitches and their spatial frequencies are different from each other. Alternatively, the first and second grating patterns are set so that the images of them have different grating pitches and different spatial frequencies. Here, the spatial frequencies of the first and second grating patterns (or the images of them) with respect to a predetermined direction differ from the spatial frequency of the particular grating pattern (or the image thereof) in that direction. In one of the aspects described hereinbefore, the spatial frequency setting may be such that the spatial frequency of the first and second moire fringes is F, the spatial frequency of the particular grating pattern is $F_0$, the spatial frequency of the image of the first grating pattern is $F_0-F$, and the spatial frequency of the image of the second grating pattern is $F_0+F$.

In a further preferred form of the present invention, the grating pitch $L_W'$ of the image of the particular grating pattern in the aforementioned direction and the pitch $L_0$ of the moire fringe in that direction, satisfy the relationship $L_W' = \epsilon L_0$ where $0 < 0.5$. Also, the grating pitch $L_{R1}'$ of the image of the first grating pattern with respect to the aforementioned direction and the grating pitch $L_{R2}'$ of the image of the second grating pattern in that direction, satisfy the relationship $(1-\epsilon)L_{R1}'=(1+\epsilon)L_{R2}'$.

In one preferred form of the present invention, images of a particular grating pattern and a reference grating pattern are formed on a certain image pickup surface and, by means of a number of picture elements arrayed regularly in this image pickup surface, the formed images are read and converted into video signals. Here, these images may be formed at spatially different positions on the image pickup surface or, alternatively, they may be formed on the image pickup surface with overlapping. In the former, the video signals corresponding to the formed images may be multiplied to obtain a signal which contains a signal component corresponding to the moire fringe. In the latter, since a moire fringe is formed on the image pickup surface, a video signal containing a signal component corresponding to the moire fringe may be obtained directly.

Where the position is to be detected in the described manner, it is convenient to extract a signal of a frequency smaller than a predetermined, frequency out of the signal that contains the signal component corresponding to the moire fringe, since then it is possible to exclude signal components corresponding to the images of the particular grating pattern and the reference grating pattern and to obtain a signal that corresponds to the moire fringe. The thus obtained signal contains the first and second signals having phases shiftable in opposite directions in accordance with the position of the particular grating pattern.

The position detecting method and apparatus of the present invention has wide applicability. An example is the alignment of two, first and second objects. Thus, in this aspect of the present invention, there is provided a method of aligning first and second objects, comprising a mark preparation step for providing the first object with first and second grating marks whose images, when formed, have different spatial frequencies with respect to a predetermined direction; a pattern preparation step for providing the second object with a grating pattern whose image, when formed, has a spatial frequency different from those of the first and second grating marks with respect to said predetermined direction; a signal formation step for taking images of the first and second grating marks and the grating pattern, and for forming a first signal corresponding to a moire fringe provided or to be provided by the images of the first grating mark and the grating pattern, and a second signal corresponding to a moire fringe provided or to be provided by the images of the second grating mark and the grating pattern; wherein the resultant first and second signals having phases shiftable in opposite directions in accordance with a positional deviation between the first and second objects; and an alignment step for aligning the first and second objects on the basis of any difference in phase between the first and second signals.

In another aspect of the present invention, which is another example of its wide applicability, there is provided an exposure apparatus for aligning a wafer with respect to said apparatus by use of a grating mark and a predetermined reference grating pattern formed on the wafer, and for exposing the wafer with a radiation beam to print a predetermined pattern on the wafer, the apparatus comprising means for directing a radiation beam to the wafer; a stage for supporting the wafer and being movable relatively to the beam directing means; driving means for relatively moving the beam directing means and the stage; image pickup means for taking images of the grating mark and the reference grating pattern; and control means responsive to an output signal from the image pickup means, for detecting any difference in phase between first and second signals corresponding to a moire fringe provided or to be provided by the images of the grating mark and the reference grating pattern and having phases shiftable in opposite directions in accordance with the positional relationship between the grating mark and the reference grating pattern, the control means controlling the driving means on the basis of the detected difference in phase between the first and second signals.

The present invention is applicable to various types of exposure apparatuses. Examples are a reduction projection type exposure apparatus (like some embodiments which will be described later), a contact type exposure apparatus, a proximity type exposure apparatus, a beam scan type exposure apparatus and so on. Also, as regards the radiation beam, light of g-line, light of i-line, an electron beam, X-rays, for example, are usable.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
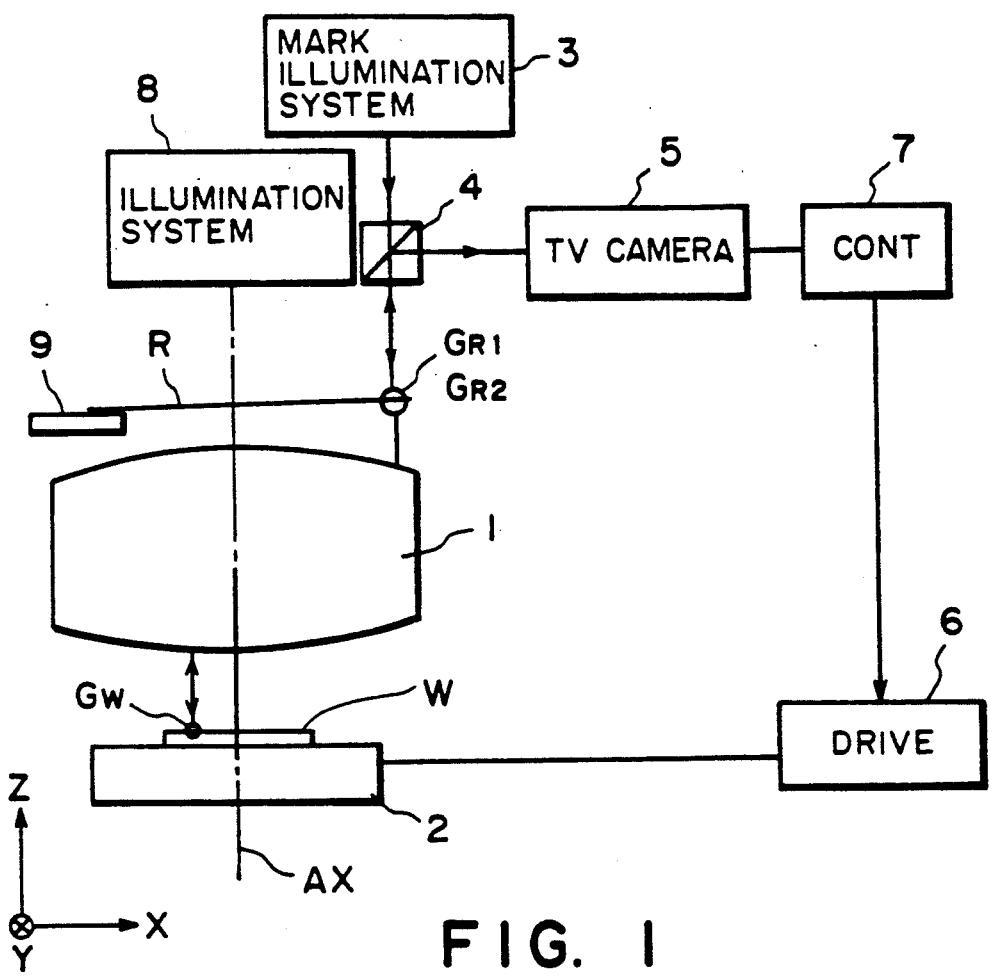
FIG. 1 is a schematic and diagrammatic view of a major portion of a reduction projection type exposure apparatus to which one embodiment of the present invention is applied.

FIG. 1 is a schematic view showing a major portion of one embodiment of the present invention. Denoted at R in this Figure is a reticle which has an integrated circuit pattern and reticle alignment marks formed on its lower surface. Denoted in FIG. 1 at $G_{R1}$ and $G_{R2}$ (small circle) are a pair of reticle alignment marks formed on the reticle R surface. As best seen in FIG.

Figure 2A:
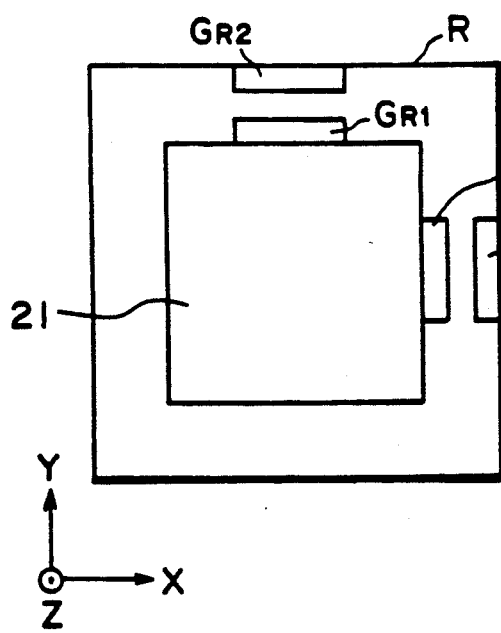
FIG. 2A is a top plan view of a reticle used in the FIG. 1 embodiment.

2A, two pairs of reticle alignment marks are formed at a part of the reticle R surface, outside a rectangular region 21 in which an integrated circuit pattern is provided. The marks $G_{R1}$ and $G_{R2}$ shown in FIG. 2A which are formed adjacent the righthand side of the region 21 of the reticle R, are those as depicted at the same reference characters in FIG. 1. The other pair of marks $G_{R1}$ and $G_{R2}$ adjacent the upper side of the region 21, are not illustrated in FIG. 1. Actually, for these marks $G_{R1}$ and $G_{R2}$ of the other pair, the FIG. 1 arrangement includes an additional mark detecting system including elements corresponding to those as denoted at numerals 3, 4 and 5 in FIG. 1. The reticle R is placed on a reticle stage 9 which is movable to position the reticle R at a site at which the integrated circuit pattern of the reticle R can be illuminated with light (by exposure radiation beam) from an illumination system 8.

Figure 2B:
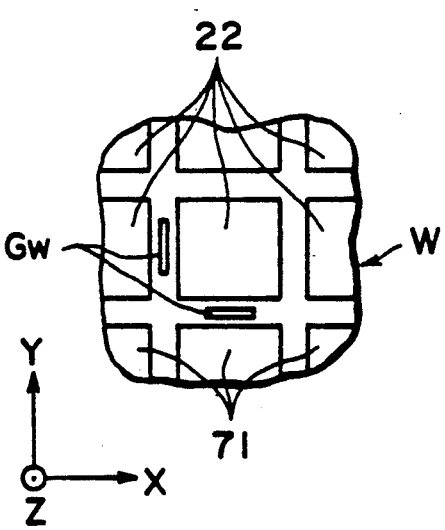
FIG. 2B is a fragmentary top plan view of a wafer used in the FIG. 1 embodiment.

Denoted at W is a wafer having wafer alignment marks $G_W$ formed on its surface. As best seen in FIG. 2B, the wafer W has a number of pattern regions (shot areas) in each of which the integrated circuit pattern of the reticle R should be transferred. Each pattern region is formed with two wafer alignment marks, in this embodiment, which correspond to the reticle alignment marks $G_{R1}$ and $G_{R2}$. These wafer alignment marks are provided in a region between adjacent pattern regions. The wafer alignment mark $G_W$ adjacent the left-hand side of the central pattern region 22 in FIG. 2B is the one to be associated with the reticle alignment marks $G_{R1}$ and $G_{R2}$ shown in FIG. 1. The other wafer alignment mark $G_W$ shown in FIG. 2B is the one to be associated with the reticle alignment marks $G_{R1}$ and $G_{R2}$ not shown in FIG. 1.

In FIG. 1, denoted at 1 is a projection lens system which is adapted to project, on the wafer W surface, the images of the integrated circuit pattern and the two pairs of reticle alignment marks $G_{R1}$ and $G_{R2}$, formed on the reticle R surface, in a reduced scale of a magnification such as 1:5, for example. Denoted at 2 is a movable wafer stage on which the wafer W is placed. Under the influence of a driving means or drive 6, the wafer stage 2 can be moved in X and Y directions as illustrated and in a Z direction along the optical axis AX of the projection lens system 1.

Mark illumination system 3 is adapted to illuminate the reticle alignment marks $G_{R1}$ and $G_{R2}$ on the reticle R surface. Denoted at 4 is a half mirror, and denoted at 5 is a TV camera which is a major constituent element of an image pickup means. The TV camera 5 has an image pickup surface on which the images of the reticle alignment marks $G_{R1}$ and $G_{R2}$ and the wafer alignment marks $G_W$ can be formed each at a predetermined magnification. In this embodiment, light from the mark illumination system 3 passes the half mirror 4 and illuminates the reticle alignment marks $G_{R1}$ and $G_{R2}$ on the reticle R surface. Any of the light reflected by the reticle alignment marks $G_{R1}$ and $G_{R2}$ is reflected by the half mirror 4 to the image pickup surface of the TV camera 5, whereby the images of the reticle alignment marks $G_{R1}$ and $G_{R2}$ are formed on this image pickup surface at a predetermined magnification.

On the other hand, under the influence of a suitable alignment means which may include an off-axis type microscope, the reticle R and the wafer W have been prealigned with each other, in preparation (prealignment) for final alignment. Therefore, the light from the illumination system 3 passing through the reticle R goes through the projection lens system 1 and illuminates the wafer alignment marks $G_W$ on the wafer W surface. Here, by means of the projection lens system 1, an image of the wafer alignment mark $G_W$ is formed at a part of the reticle R surface, adjacent the reticle alignment marks $G_{R1}$ and $G_{R2}$. The light from the image of the wafer alignment mark $G_W$ is reflected by the half mirror 4 to the TV camera 5, whereby an image of the wafer alignment mark $G_W$ is formed on its image pickup surface at a predetermined magnification.

Figure 3A:
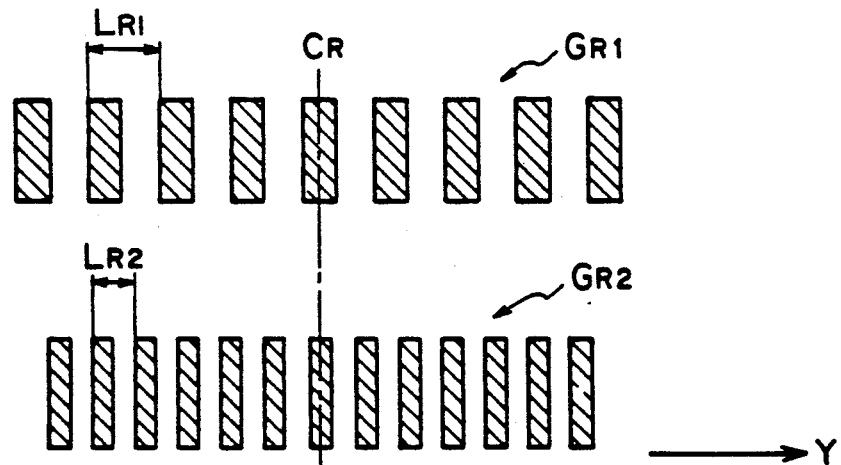
FIG. 3A is an enlarged schematic view of reticle alignment marks shown in FIG. 2A.

In this embodiment, the mark illumination system 3 illuminates the reticle alignment marks $G_{R1}$ and $G_{R2}$ as well as the wafer alignment mark $G_W$, with light of a wavelength equal to that of the exposure light supplied from the illumination system 8. Although the mark illumination may use non-sensitive light of a wavelength different from that of the exposure light, in such occasion it is necessary to provide a lens means or a plate means in the path of light between the reticle R and the projection lens system 1 for correction of chromatic aberration, so as to ensure that with respect to the light of such wavelength the opposing surfaces of the reticle R and the wafer W are placed in an optically conjugate relationship. As best seen in FIG. 3A, the reticle alignment marks $G_{R1}$ and $G_{R2}$ on the reticle R surface are provided by grating-like chromium patterns each having pattern elements arrayed regularly in the Y direction. The reticle alignment mark $G_{R1}$ has a grating pitch $L_{R1}$ in respect to the Y direction, while the reticle alignment mark $G_{R2}$ has a grating pitch $L_{R2}$ in respect to the Y direction. The reticle alignment marks $G_{R1}$ and $G_{R2}$ are so formed that their centers $C_R$ are aligned with each other, as illustrated.

Figure 3B:
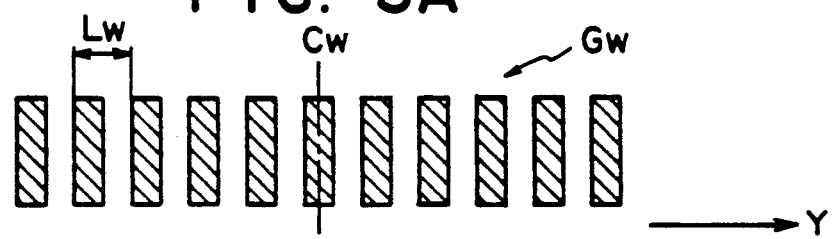
FIG. 3B is an enlarged schematic view of a wafer alignment mark shown in FIG. 2B.

The wafer alignment mark $G_W$ on the wafer W surface is similar to the reticle alignment marks $G_{R1}$ and $G_{R2}$ and, as best seen in FIG. 3B, it is provided by a grating-like pattern defined by recesses and protrusions arrayed regularly in the Y direction. The wafer alignment mark has a grating pitch $L_W$ and a center $C_W$, in respect to the Y direction.

The reticle alignment marks $G_{R1}$ and $G_{R2}$ have different grating pitches $L_{R1}$ and $L_{R2}$, so as to ensure that the images of these reticle alignment marks as formed on the image pickup surface have different grating pitches. Therefore, the reticle alignment marks $G_{R1}$ and $G_{R2}$ have different spatial frequencies with respect to the Y direction and, similarly, the images of the reticle alignment marks have different spatial frequencies with respect to the Y direction. On the other hand, the grating pitch of the wafer alignment mark $G_W$ is so set that the grating pitch of the image thereof as formed on the image pickup surface differs from the grating pitches of the images of the reticle alignment marks $G_{R1}$ and $G_{R2}$ as formed on the image pickup surface. As a result, the image of the wafer alignment mark $G_W$ has a spatial frequency in respect to the Y direction which is different from the spatial frequencies in the Y direction of the images of the reticle alignment marks $G_{R1}$ and $G_{R2}$.

Further, these marks of the reticle and the wafer are so set that, when a pattern region on the wafer W surface is aligned with the integrated circuit pattern of the reticle R, the center $C_W$ of the image of the wafer alignment mark $G_W$ is aligned with the centers $C_R$ of the images of the reticle alignment marks $G_{R1}$ and $G_{R2}$, respectively, as formed on the image pickup surface.

In the present embodiment, no moire fringe is formed on the image pickup surface. Rather, in the present embodiment, a moire fringe which is to be provided by the image of a reticle alignment mark $G_{R1}$ and the image of a wafer alignment mark $G_W$ (if they are superposed one upon another) and a moire fringe which is to be provided by the image of a reticle alignment mark $G_{R2}$ and the image of a wafer alignment mark $G_W$ (if they are superposed one upon another) have a set spatial frequency F in respect to the Y direction; the image of the wafer alignment mark $G_W$ has a set spatial frequency $F_0$ in respect to the Y direction; the image of the reticle alignment mark $G_{R1}$ has a set spatial frequency $F-F_0$ in respect to the Y direction; the image of the reticle alignment mark $G_{R2}$ has a set spatial frequency $F+F_0$ in respect to the Y direction; and first and second signals corresponding to the aforementioned moire fringes are formed which signals have phases shiftable in opposite directions in accordance with any positional deviation between the reticle R and the wafer W.

More specifically, the first signal corresponds to a moire fringe having a standard pitch $L_0$, to be provided by the images of the wafer alignment mark $G_W$ and the reticle alignment mark $G_{R1}$ as formed on the image pickup surface of the TV camera, and the second signal corresponds to a moire fringe having the standard pitch $L_0$, to be provided by the images of the wafer alignment mark $G_W$ and the reticle alignment mark $G_{R2}$. Any difference in phase of the first and second signals is detected and, on the basis of this detection, the alignment of the wafer W and the reticle R is executed. The phases of the first and second signals are shiftable in opposite directions in accordance with the positional deviation between the wafer W and the reticle R. However, except for this, the first and second signals have the same parameters such as amplitude, period, quantity of shift and the like.

Additionally, the grating patterns of the reticle alignment marks $G_{R1}$ and $G_{R2}$ and the grating pattern of the wafer alignment mark $G_W$ as well as the TV camera 5 are set so that, when the imaging magnification in respect to the image formation of the reticle alignment marks $G_{R1}$ and $G_{R2}$ upon the image pickup surface is denoted by $\beta_R$ and the imaging magnification in respect to the image formation of the wafer alignment mark $G_W$ upon the image pickup surface is denoted by $\beta_W$, the grating pitches $L_{R1}$, $L_{R2}$ and $L_W$ of the reticle alignment marks $G_{R1}$ and $G_{R2}$ and the wafer alignment mark $G_W$ satisfy equation (1) set forth below. By this, the resolution and precision in detection of the mark position can be enhanced, whereby precise alignment of the reticle R and the wafer W is ensured.

$$\beta_W \cdot L_W = \beta_R \cdot (1-\epsilon)L_{R1} = \beta_R(1+\epsilon) \cdot L_{R2} \quad (1)$$
$$= \epsilon \cdot \beta_W \cdot L_0$$

wherein $\epsilon$ is a real number in the range of $0<\epsilon<0.5$.

The image pickup surface of the TV camera 5 is provided by a number of picture elements which are arrayed regularly in the Y and Z directions, each picture element having a photoelectric converting function for the reading of the image (intensity distribution thereof) to be formed on the image pickup surface. Accordingly, on this image pickup surface, a CCD (charge coupled device) or similar device is provided.

The images of the reticle alignment marks $G_{R1}$ and $G_{R2}$ and the image of the wafer alignment mark $G_W$ are so formed on the image pickup surface that a number of grating patterns (images) are arrayed in the Y direction. In the present embodiment, the used TV camera 5 used is such that equation (2), set forth below, is satisfied where the pitch of the arrayed picture elements in the Y direction is denoted by $L_m$:

$$\beta_W = (\epsilon \cdot L_m \cdot 2M)/(L_W) \quad (2)$$

wherein M is an arbitrary integral number.

Next, the principle of alignment method in the present embodiment will be explained in greater detail.

The video signal obtained at the TV camera 5 and related to each mark image is transferred to a control device 7. At this control device 7, the video signal is sampled at a predetermined period, corresponding to the picture elements of the TV camera 5, so that analog data is converted into digital data. The thus obtained digital data is memorized into an image memory of the control device 7, in accordance with the Y-Z address of each picture element. Here, according to equation (1), the pitch of the moire fringe in respect to the Y direction is $L_W$ and the grating pitch $L_W'$ of the image of the wafer alignment mark $G_W$ has a relationship $L_W' = \epsilon L_0$ and, additionally, the grating pitches $L_{R1}'$ and $L_{R2}'$ of the images of the reticle alignment marks $G_{R1}$ and $G_{R2}$ in the Y direction have a relationship $(1-\epsilon)L_{R1}' = (1+\epsilon)L_{R2}'$.

Figure 4:
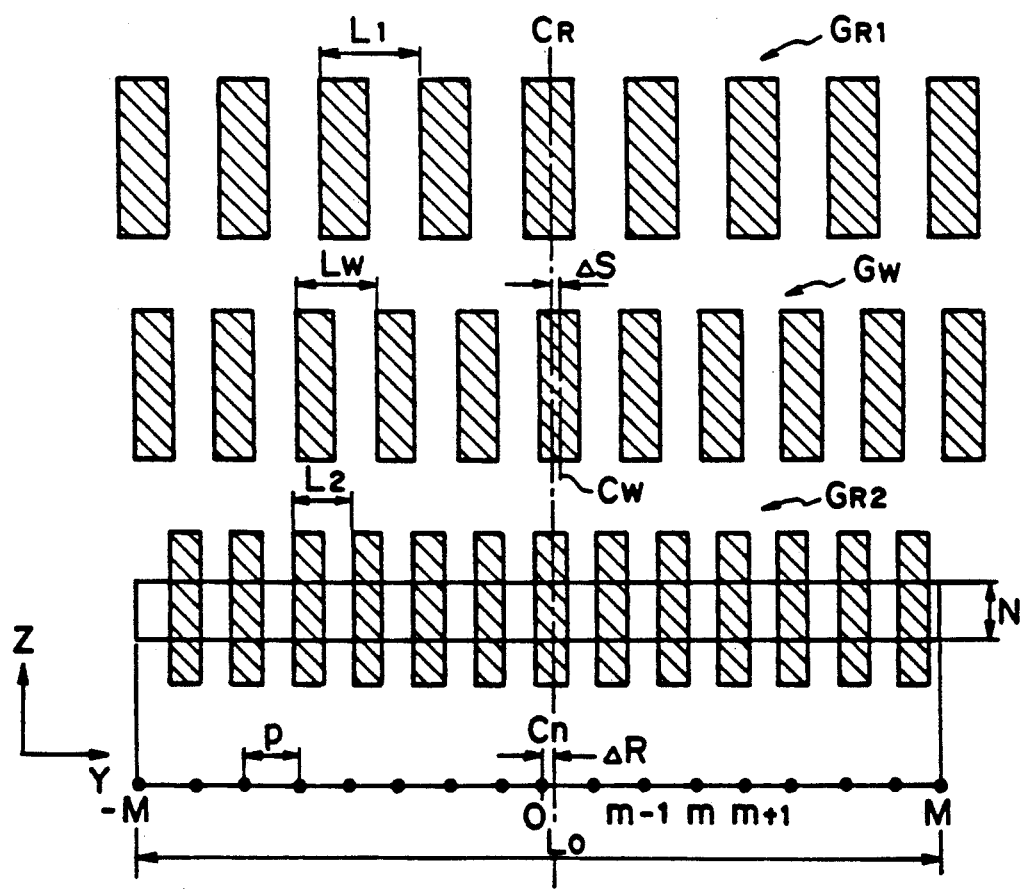
FIG. 4 is a schematic view, illustrating images of two reticle alignment marks and one wafer alignment mark, as formed on an image pickup surface.

FIG. 4 is an explanatory view of the image data to be memorized into the image memory and concerning the reticle alignment marks $G_{R1}$ and $G_{R2}$ and the wafer alignment mark $G_W$, the image data corresponding to the state of images as formed on the image pickup surface of the TV camera 5. In FIG. 4, for convenience in illustration, each mark is depicted in the scale as converted with respect to the wafer W surface.

In FIG. 4, $L_1$ denotes the grating pitch of the reticle alignment mark $G_{R1}$; $L_2$ denotes the grating pitch of the reticle alignment mark $G_{R2}$; p denotes the pitch of picture elements; $C_R$ denotes the central position of each of the reticle alignment marks $G_{R1}$ and $G_{R2}$; and $\Delta S$ denotes the quantity of relative deviation between the central position $C_R$ and the central position $C_W$ of the wafer alignment mark $G_W$. By using the coefficients mentioned hereinbefore, these values can be expressed as follows:

$$\begin{aligned}
L_1 &= \beta_R/\beta_W \cdot L_{R1} \\
L_2 &= \beta_R/\beta_W \cdot L_2 \\
L_W &= (1-\epsilon)L_1 = (1+\epsilon)L_2 \\
&= \epsilon \cdot 2M \cdot p \\
&= \epsilon \cdot L_0 \\
p &= L_m/\beta_W
\end{aligned} \quad (3)$$

In FIG. 4, character $C_n$ depicts the center position, as predetermined, with respect to the image memory (i.e. the image pickup surface) in regard to the Y direction. Since the reticle R and the TV camera 5 have been pre-aligned with each other, in preparation, the center position $C_n$ is present in the neighborhood of the center position $C_R$. Any deviation at that time is by an amount $\Delta_R$. Character m corresponds to a value in the Y coordinate scaled with a unit picture element pitch. As regards the image of each alignment mark, the control device 7 sets a window having a length 2M in the Y direction and a width N in the Z direction, as illustrated in respect to the reticle alignment mark $G_{R2}$, and executes integration of the digital data with respect to the Z direction. Examples of one-dimensional image data as obtainable from such integration, are illustrated in FIG. 5.

Figure 5:
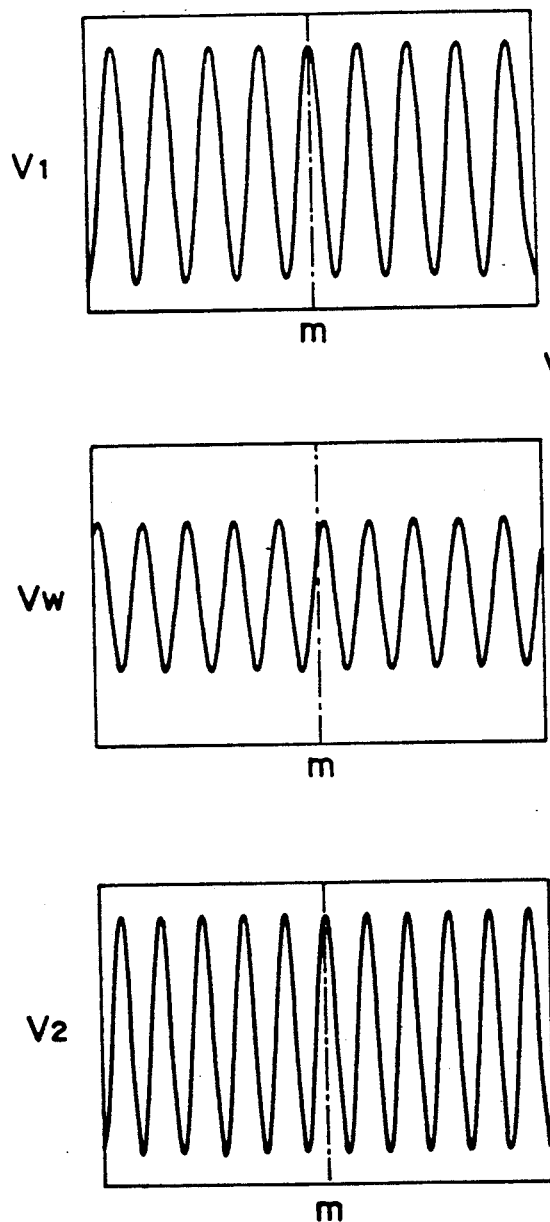
FIG. 5 is a graph showing video signals corresponding to the images shown in FIG. 4.

Characters $V_1$, $V_W$ and $V_2$ in FIG. 5 denote one-dimensional image data corresponding to the reticle alignment mark $G_{R1}$, the wafer alignment mark $G_W$ and the reticle alignment mark $G_{R2}$, respectively.

Here, the one-dimensional image data can be expressed approximately such as by equation (4) below, wherein $a_1$, $b_1$, $a_w$, $b_w$, $a_2$ and $b_2$ are constants and wherein $w_0 = 2\pi/L_0$:

$$\begin{aligned}
G_{R1}; V_1(m) &= a_1 + b_1 \cos[(2\pi/L_1)(p \cdot m - \Delta R)] \\
&= a_1 + b_1 \cos\{mp[(1-\epsilon)/\epsilon] \cdot w_o - \Delta R/L_1\} \\
G_W; V_w(m) &= a_w + b_w \cos[(2\pi/L_w)(p \cdot m - \Delta R - \Delta S)] \\
&= a_w + b_w \cos[mp \cdot (1/2) \cdot w_o - \Delta R/L_w - \Delta S/L_w] \\
G_{R2}; V_2(m) &= a_2 + b_2 \cos[(2\pi/L_2)(p \cdot m - \Delta R)] \\
&= a_2 + b_2 \cos\{mp[(1+\epsilon)/\epsilon] \cdot w_o - \Delta R/L_2\}
\end{aligned} \quad (4)$$

Figure 6A:
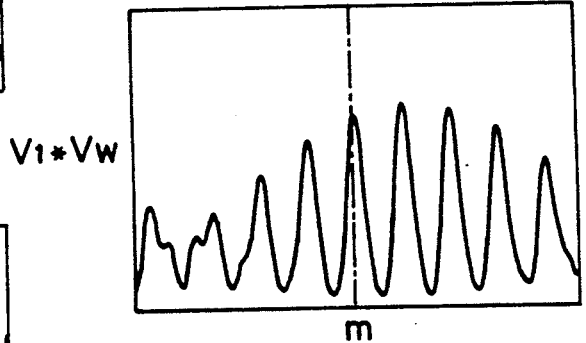
FIGS. 6A and 6B and FIGS. 7A and 7B are graphs, for explaining the position detecting method of the present invention.
Figure 6B:
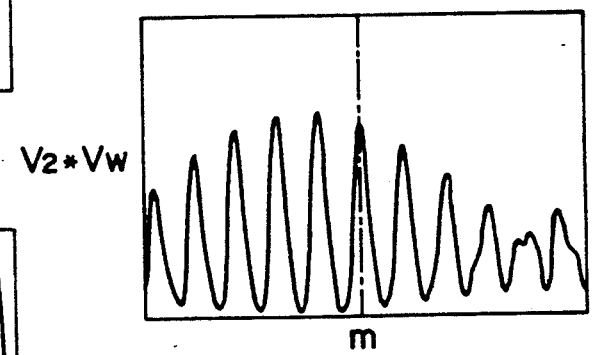

The control device 7 executes the multiplication of the signals $V_1(m)$ and $V_w(m)$ and the signals $V_2(m)$ and $V_w(m)$. The results are illustrated in FIGS. 6A and 6B, respectively.

The signal $V_1 \times V_w$ corresponds to the one-dimensional data of the multiplied signals $V1(m)$ and $V_w(m)$, while the signal $V_2 \times V_w$ corresponds to the one-dimensional data of the multiplied signals $V_2(m)$ and $V_w(m)$, and each obtained signal contains a signal component corresponding to a moire fringe. From equations (2), (3) and (4), each one-dimensional image data can be expressed as follows:

$$V_1 \times V_w(m) = \qquad (5)$$

$$a_1 a_w + (1/2) b_1 b_w \cos[mpw_o + \Delta R/L_1 - \Delta R/L_w - \Delta S/L_w] +$$

$$a_w b_1 \cos\{[mp(1-\epsilon)/\epsilon]w_o - \Delta R/L_1\} +$$

$$a_1 b_w \cos[mp(1/\epsilon)w_o - \Delta R/L_w - \Delta S/L_w] +$$

$$(1/2) b_1 b_w \cos\{mp[(2-\epsilon)/\epsilon]w_o - \Delta R/L_1 - \Delta R/L_w - \Delta S/L_w\}$$

$$V_2 \times V_w(m) =$$

$$a_2 a_w + (1/2) b_2 b_w \cos[mpw_o - \Delta R/L_2 + \Delta R/L_w + \Delta S/L_w] +$$

$$a_2 b_w \cos[mp(1/\ )w_o - R/L_w - S/L_w] +$$

$$a_w b_2 \cos\{mp[(1+\epsilon)/\epsilon]w_o - \Delta R/L_1\} +$$

$$(1/2) b_2 b_w \cos\{mp[(2+\epsilon)/\epsilon]w_o - \Delta R/L_2 - \Delta R/L_w - \Delta S/L_2\}$$

wherein $$w_0 < [(1-\epsilon)/\epsilon]w_0 < (1/\epsilon)w_0 < [(1+\epsilon)/\epsilon]w_0 < [(2-\epsilon)/\epsilon]w_0 < [(2+\epsilon)/\epsilon]w_0$$

Figure 7A:
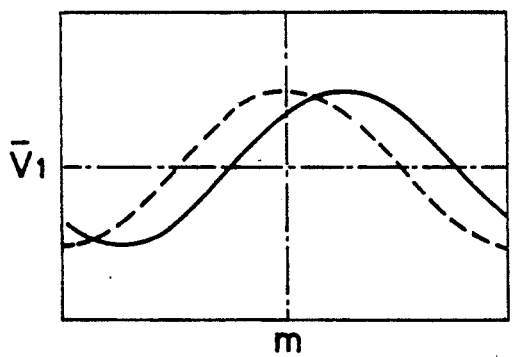
Figure 7B:
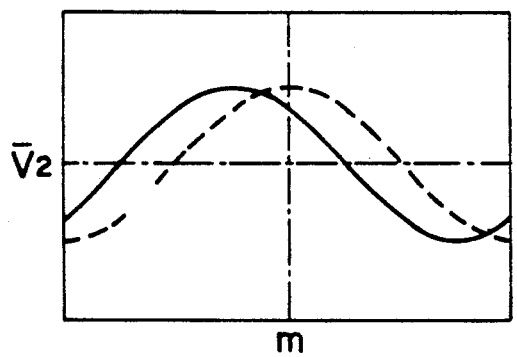

Next, when the part of the frequency of each of the signals $V_1 \times V_w(m)$ and $V_2 \times V_w(m)$, not lower than $(1/\epsilon)w_0$, is cut by means of filtering, the one-dimensional image data of the signals $V_1 \times V_w(m)$ and $V_2 \times V_w(m)$ are transformed into those signals, as illustrated at solid lines in FIGS. 7A and 7B, having phases shifted in opposite directions (each corresponding to a moire fringe of standard frequency $F_0$). The broken lines correspond to the image data as assumed when $\Delta R = \Delta S = 0$, i.e., when no positional deviation is present. In FIGS. 7A and 7B, characters $\overline{V_1}$ and $\overline{V_2}$ represent the image data of the filtered signals $V_1 \times V_w(m)$ and $V_2 \times V_w(m)$, respectively, and correspond to the first signal and the second signal, respectively.

These image data can be expressed as follows:

$$\overline{V_1}(m) = A_1 + B_1 \cos(mpw_0 + \Delta R/L_1 - \Delta R/L_w - \Delta S/L_w)$$

$$\overline{V_2}(m) = A_2 + B_2 \cos(mpw_0 - \Delta R/L_2 + \Delta R/L_w + \Delta S/L_w) \qquad (6)$$

where $A_1$, $B_1$, $A_2$ and $B_2$ are constants. Here, $V(m) = A + B\cos(mpw_o + \Delta)$ and when $w_0 = 2\pi/L_0$ and if $-M < m < M$, then $V(m)$ is given and, since from equation (3) the relationship between the pitch p of the picture elements and the standard pitch $L_0$ of the moire fringe is represented by $L_0 = 2 Mp$, and since the magnification $\beta_W$ is adjusted in accordance with the picture element pitch $L_m$ as set forth in equation (2), the phase $\Delta$ of the image data can be expressed as follows:

$$\sum_{m=-M}^{M} V(m) \times \sin(mpw_o) = A \sum_{m=-M}^{M} \sin(mpw_o) +$$

$$B \sum_{m=-M}^{M} \cos(mpw_o + \Delta)\sin(mpw_o)$$

$$= A \sum_{m=-M}^{M} \sin(m/M \cdot \pi) + B/2 \times$$

$$\left\{ \sum_{m=-M}^{M} \sin[(2m/M)\pi + \Delta] + \sum_{m=-M}^{M} \sin(\Delta) \right\}$$

(wherein $\sum_{m=-M}^{M} \sin[(km/M)\pi + \delta] = 0$ where $k$ is an integral number other than 0 and $\delta$ is an arbitrary real number.)

$$= 0 + B(0 + M\sin(\Delta))$$
$$= BM\sin(\Delta)$$

Similarly, $$\sum_{m=-M}^{M} V(m) \times \sin(mpw_o) = BM\cos(\Delta)$$

$$\therefore \tan\Delta = \sin(\Delta)/\cos(\Delta)$$

$$= \left[\sum_{m=-M}^{M} V(m) \times \sin(mpw_o)\right] / \left[\sum_{m=-M}^{M} V(m) \times \cos(mpw_o)\right]$$

$$\therefore \Delta = \tan^{-1}\left\{\left[\sum_{m=-M}^{M} V(m) \times \sin(mpw_o)\right] / \left[\sum_{m=-M}^{M} V(m) \times \cos(mpw_o)\right]\right\}$$

Accordingly, the phases $\Delta_1$ and $\Delta_2$ of the data $V_1$ and $V_2$ can be expressed as follows:

$$\Delta_1 = -\Delta R/L_1 + \Delta R/L_w + \Delta S/L_w \qquad (7)$$

$$= \tan^{-1}\left\{\left[\sum_{m=-M}^{M} \overline{V_1}(m) \times \sin(mpw_o)\right] / \left[\sum_{m=-M}^{M} \overline{V_1}(m) \times \cos(mpw_o)\right]\right\}$$

$$\Delta_2 = \Delta R/L_2 - \Delta R/L_w - \Delta S/L_w$$

$$= \tan^{-1}\left\{\left[\sum_{m=-M}^{M} V_2(m) \times \sin(mpw_o)\right] / \left[\sum_{m=-M}^{M} V_2(m) \times \cos(mpw_o)\right]\right\}$$

Thus, the control device 7 calculates the difference between the phases Δ1 and Δ2 in the following manner:

$$\Delta 1 - \Delta 2 = 2\Delta S/L_w + \Delta R(-1/L_1 + 1 - L_w + 1/L_w - 1/L_2)$$
$$= 2\Delta S/L_w + \Delta R/L_w[-(1-\epsilon) + 1 + 1 - (1+\epsilon)]$$
$$= 2\Delta S/L_w$$

From the difference Δ1−Δ2 in phase between the first and second signals and from the pitch $L_W$ of the wafer alignment mark $G_W$, the relative positional deviation ΔS between the reticle alignment marks $G_{L1}$ and $G_{L2}$ and the wafer alignment mark $G_W$, as measured on the surface of the wafer W, is calculated by using the following equation:

$$\Delta S = L_w(\Delta 1 - \Delta 2)/2 \tag{8}$$

Therefore, the relative position of the reticle mark center $C_R$ and the wafer mark center, namely, the positional deviation ΔS between the reticle R and the wafer W, is detected.

Subsequently, the control device 7 supplies a signal to the driving means 6 to cause the same to move the movable wafer stage 2 by an amount corresponding to the detected relative positional deviation ΔS, such that by the driving means 6 the movable wafer stage 2 is moved to align the wafer W with respect to the reticle R.

With the alignment method described above, the relative positional deviation ΔS which is the information (equation (4)) of the grating pitch $L_W$ (frequency $W_0/\epsilon$) on the wafer W surface can be transformed into the information of the standard pitch $L_0$ (frequency $W_0$), i.e., equation (6). As a result, the deviation ΔS can be detected by using a greater number of pieces of picture element information. Therefore, in substance, the deviation ΔS is expanded. Namely, in effect, the picture element pitch $L_m$ is reduced and the resolution of the TV camera 5 is enhanced. Consequently, the precision of detection can be improved. Further, in the present embodiment, the deviation ΔS between the reticle R and the wafer W can be detected, independently of any positional deviation ΔR between the preset center $C_m$ of the image memory of the control device 7 and the center $C_R$ of the reticle alignment marks $G_{R1}$ and $G_{R2}$.

In the embodiment described hereinbefore, in execution of calculation of the phases Δ1 and Δ2 for calculation of the deviation ΔS, computation including a function $\tan^{-1}$ is executed. Since, however, generally the result of computation related to the function $\tan^{-1}$ easily contains an error, it is preferable that the number of computations using such a function is small. In consideration of this, the following calculation may preferably be made, and if this is done, then only a single computation using the function $\tan^{-1}$ is required.

$$\Delta S = L_w/2(\Delta 1 - \Delta 2) = L_w/2 \tan^{-1}[(\alpha - \beta)/(1 + \alpha\beta)]$$

$$\alpha = \sum_{m=-M}^{M} [\overline{V_1}(m) \times \sin(mpw_o)] / \sum_{m=-M}^{M} [\overline{V_1}(m) \times \cos(mpw_o)]$$

$$\beta = \sum_{m=-M}^{M} [\overline{V_2}(m) \times \sin(mpw_o)] / \sum_{m=-M}^{M} [\overline{V_2}(m) \times \cos(mpw_o)]$$

Figure 8:
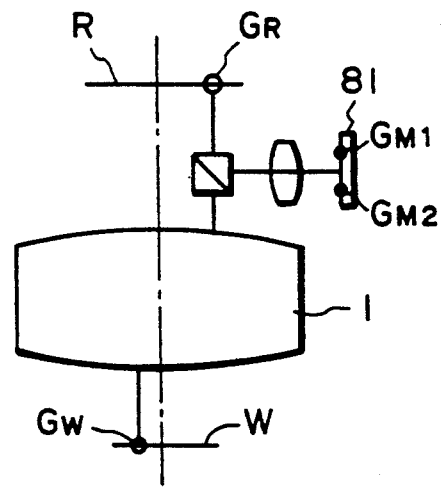
FIG. 8 is a schematic view of a major part of a reduction projection type exposure apparatus in which another embodiment of the present invention is incorporated.

FIG. 8 is a schematic view showing a major part of another embodiment of the present invention.

In the embodiment described hereinbefore, an image of a wafer alignment mark is projected in the neighborhood of a reticle alignment mark and any relative positional deviation therebetween is detected. In the present embodiment, as compared therewith, a reference mask plate 81 is provided separately. Any relative positional deviation between a wafer alignment mark $G_W$ and the reference mask plate 81 as well as any relative positional deviation between a reticle alignment mark $G_R$ and the reference mask plate 81, are detected in sequence and, by doing so, any relative positional deviation between the reticle alignment mark $G_R$ and the wafer alignment mark $G_W$ is detected. In this example, one grating-like mark $G_W$ is formed on the wafer W and one grating-like mark $G_R$ is formed on the reticle R. On the other hand, two grating-like marks $G_{M1}$ and $G_{M2}$ are provided on the reference mask plate 81.

Namely, in the present embodiment, the wafer W surface is provided with the wafer alignment mark $G_W$ having a grating pitch $L_W$, while the reference mask plate surface is provided with two reference marks $G_{M1}$ and $G_{M2}$ having grating pitches of $L_{M1}$ and $L_{M2}$. An image of the wafer alignment mark $G_W$ is formed on the surface of the reference mask plate 81 and, then, an image of the reference mask plate 81 surface is formed on an image pickup surface of a TV camera at a predetermined magnification. Here, by using a control device such as at 7 shown in FIG. 1, any difference in phase between (i) a signal corresponding to a moire fringe of a standard pitch $\beta_W L_0$, to be provided by the images of the wafer alignment mark $G_W$ and the reference mark $G_{M1}$ as formed on the image pickup surface and (ii) a signal corresponding to a moire fringe of a standard pitch $\beta_W L_0$ to be provided by the images of the wafer alignment mark $G_W$ and the reference mark $G_{M2}$, is detected. On the basis of this detection, the alignment of the wafer W and the reference mask plate 81 is executed. Subsequently, an image of the reticle alignment mark $G_R$ formed on the reticle R surface and having a grating pitch $L_W$, is formed on the reference mask plate 81 and, thereafter, an image of the reference mask plate 81 surface is formed on the image pickup surface of the TV camera at a predetermined magnification. Then, the control means 7 detects any difference in phase between (i) a signal corresponding to a moire fringe to be provided by the images of the reticle alignment mark $G_R$ and the reference mark $G_{M1}$ as formed on the image pickup surface and (ii) a signal corresponding to a moire fringe to be provided by the images of the reticle alignment mark $G_R$ and the reference mark $G_{M2}$ on the basis of this detection, the alignment of the reticle and the reference mask plate 81 is executed. In the present embodiment, where the imaging magnification in regard to the image formation of the reticle R upon the image pickup surface is denoted by $\beta_R$, the imaging magnification in regard to the image formation of the wafer W upon the image pickup surface is denoted by $\beta_W$, and the imaging magnification in regard to the image formation of the reference mask plate 81 upon the image pickup surface is denoted by $\beta_M$, the structure is set so as to satisfy the following condition, like equation (1):

$$\beta_W L_W = \beta_R L_R = \beta_M \cdot (1 - \epsilon) L_{M1}$$
$$= \beta_M \cdot (1 + \epsilon) L_{M2} = \epsilon \beta_W L_0$$

where $\epsilon$ is a real number in the range of $0 < \epsilon < 0.5$.

In the embodiments described hereinbefore, a laser may be used as a light source in the mark illumination system to allow illumination of the wafer W with coherent light. Further, the wafer alignment mark $G_W$ on the wafer W may be one having a grating pitch of $2 \times L_W$ and, on the other hand, the structure may be modified so that zero-th order light is intercepted at the position of a pupil of the TV camera or at a position which is optically conjugate with the pupil position such that on the image pickup surface of the TV camera a dark-field image of the wafer alignment mark, having a grating pitch $L_W$, is formed. Such dark-field image pickup can provide an advantage that an image of a desired grating pitch $L_W$ is obtainable without being affected by the effect of a resist.

Figure 9:
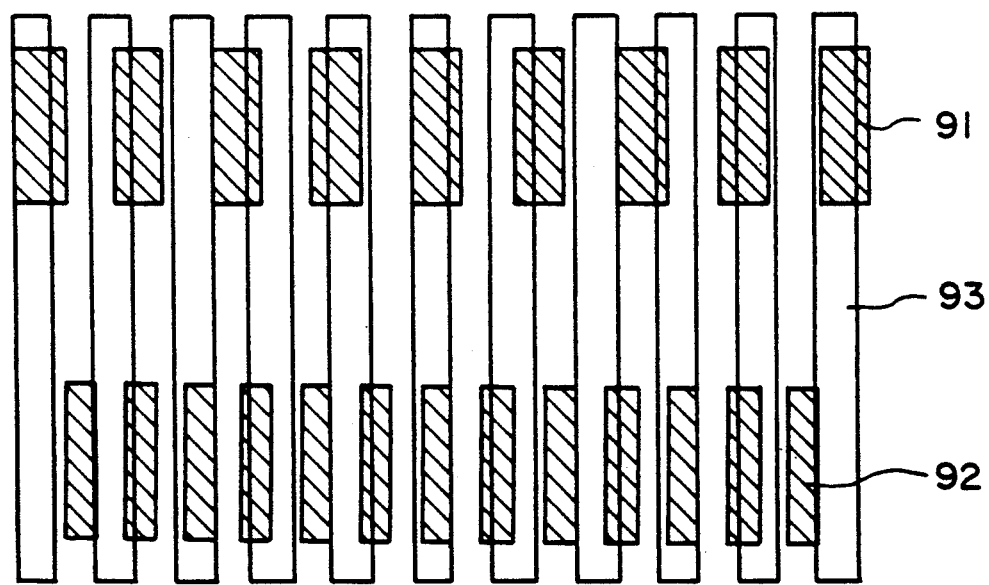
FIG. 9 is a schematic view showing images of reticle and wafer alignment marks formed on an image pickup surface, in accordance with a further embodiment of the present invention.

Further, in the embodiments described hereinbefore, the structure may be modified so that, as shown in FIG. 9, an image 93 of a wafer alignment mark $G_W$ as formed on the image pickup surface is superposed one upon another with images 91 and 92 of reticle alignment marks $G_{R1}$ and $G_{R2}$ as formed on the image pickup surface (or the images of the grating marks $L_{M1}$ and $L_{M2}$ of the reference mask plate 81 as formed on the image pickup surface). In that occasion, in addition to the images of these marks, moire fringes are actually formed on the image pickup surface of the TV camera. As a result, the video signal obtainable from a TV camera contains a signal component corresponding to the moire fringe. Accordingly, the computation of $V_2 \times V_W$ becomes unnecessary, which leads to reduction in time for the positional error detection.

Further, in the embodiments described hereinbefore, the two grating marks or the images thereof with respect to which any relative positional deviation should be detected, comprise patterns having the same orientation in regard to a direction perpendicular to the direction of array of the patterns. However, such two grating marks may comprise patterns oriented with mutual inclination.

While the exposure apparatuses shown in FIGS. 1 and 8 are those of the reduction projection type, the present invention is applicable also to exposure apparatuses of contact exposure type, proximity exposure type and the beam scan exposure type. Similarly, the light used for lithographic exposure is not limited to a particular one, but light of g-line, light of i-line, an electron beam, a laser beam and X-rays, for example, are usable. Further, a desired type of light source can be used in the mark illumination system.

In the position detecting method and apparatus having been described with reference to some embodiments, any positional deviation between a reticle (mask plate) and a wafer, namely, the relative position of one of them to the other, is detected by using a signal corresponding to a moire fringe provided by or to be provided by grating marks formed on the reticle and the wafer. This signal has a period (pitch) which is greater than that of a video signal corresponding to the grating marks and, therefore, the resolution and precision of the position detection can be enhanced as described, independently of the fact that a TV camera of conventional type is used. Additionally, at least two signals corresponding to the moire fringes are formed which are so set that the phases of the two signals shift in opposite directions in accordance with the positional deviation. As a result, the resolution of position detection can be enhanced at least twice.

While the invention has been described with reference to the structures disclosed herein, it is not confined to the details set forth and this application is intended to cover such modifications or changes as may come within the purposes of the improvements or the scope of the following claims.

What is claimed is:

1. A position detecting method for detecting the relative position of a particular grating pattern with respect to a predetermined reference grating pattern, said method comprising:

a signal forming step for forming first and second signals corresponding to moire fringes provided or to be provided by the patterns; said signal forming step comprising a first-signal forming step for forming, by using the particular grating pattern and one portion of the reference grating pattern, the first signal corresponding to a first moire fringe provided by or to be provided by these patterns, and a second-signal forming step for forming, by using the particular grating pattern and another portion of the reference grating pattern, the second signal corresponding to a second moire fringe provided by or to be provided by these patterns; the first and second signals having phases shiftable in opposite directions in accordance with the position of the particular grating pattern with respect to the reference grating pattern; and a position detecting step for detecting the position of the particular grating pattern with respect to the reference grating pattern on the basis of any difference in phase between the first and second signals.

2. A method according to claim 1, wherein the reference grating pattern comprises, as the one portion and the other portion thereof respectively, first and second grating patterns having different spatial frequencies with respect to a predetermined direction and wherein the signal forming step comprises the first signal forming step for forming, by using the particular grating pattern and the first grating pattern, the first signal corresponding to a first moire fringe provided by or to be provided by these patterns, and the second signal forming step for forming, by using the particular grating pattern and the second grating pattern, the second signal corresponding to a second moire fringe provided by or to be provided by these patterns.

3. A method according to claim 1, wherein the reference grating pattern comprises, as the one portion and the other portion thereof respectively, first and second grating patterns the images of which, when formed, have different spatial frequencies in respect to a predetermined direction, and wherein said signal forming step comprises an image forming step for forming images of the particular grating pattern and the first and second grating patterns, a first signal forming step for forming the first signal corresponding to a first moire fringe provided by or to be provided by the images of the particular grating pattern and the first grating pattern, and a second signal forming step for forming the second signal corresponding to a second moire fringe provided by or to be provided by the images of the particular grating pattern and the second grating pattern, and wherein the images of the first and second grating patterns have spatial frequencies of $F_0-F$ and $F_0+F$, respectively, where $F_0$ denotes the spatial frequency in the predetermined direction of the image of the particular grating pattern and F denotes the spatial frequency in the predetermined direction of the first and second moire fringes.

4. A method according to claim 3, wherein, at the image forming step, the image of the particular grating pattern and the images of the first and second grating patterns are formed with spatial superposition.

5. A method according to claim 3, wherein, at the image forming step, the image of the particular grating pattern and the images of the first and second grating patterns are formed at spatially different positions.

6. A method according to claim 3, wherein, at the image forming step, the particular grating pattern is imaged with a magnification $\beta_W$ and the first and second grating patterns are imaged with a magnification $\beta_R$, and wherein, when the grating pitch of the particular grating pattern in the predetermined direction is denoted by $L_W$, the grating pitch of the first grating pattern in the predetermined direction is denoted by $L_{R1}$, the grating pitch of the second grating pattern in the predetermined direction is denoted by $L_{R2}$ and the pitch of the first and second moire fringes in the predetermined direction is denoted $\beta_W \cdot L_0$, by then the following relation is satisfied:

$$\beta_W \cdot L_2 = \beta_R(1-\epsilon)L_{R1} = \beta_R(1+\epsilon)L_{R2} = \epsilon \cdot \beta_W \cdot L_0$$

where $\epsilon$ is a real number in the range of $0 < \epsilon < 0.5$.

7. A method according to claim 6, wherein, at the image forming step, the images of the particular grating pattern and the first and second grating patterns are formed on an image pickup surface on which a number of picture elements are arranged in the predetermined direction, and wherein the following relationship is satisfied:

$$\epsilon_W = (\epsilon \cdot L_m \cdot 2M)/L_W$$

where $L_m$ is the pitch of the arrayed picture elements and M is an arbitrary integral number.

8. A position detecting device for detecting the relative position of a particular grating pattern with respect to a predetermined reference grating pattern, said device comprising:

image forming means for forming images of the patterns; and position detecting means for forming first and second signals corresponding to moire fringes provided or to be provided by the images of the patterns; said position detecting means forming the first signal by using the particular grating pattern and one portion of the reference grating pattern with the first signal thereby corresponding to a first moire fringe provided by or to be provided by these patterns, and forming the second signal by using the particular grating pattern and another portion of the reference grating pattern with the second signal thereby corresponding to a second moire fringe provided by or to be provided by these patterns; the first and second signals having phases shiftable in opposite directions in accordance with the position of the particular grating pattern with respect to the reference grating pattern; said position detecting means detecting the position of the particular grating pattern with respect to the reference grating pattern on the basis of any difference in phase between the first and second signals.

9. A device according to claim 8, wherein the reference grating pattern comprises, as the one portion and the other portion thereof respectively, first and second grating patterns the images of which, when formed, have different spatial frequencies with respect to a predetermined direction, and wherein said image forming means is arranged to form the images of the particular grating pattern and the first grating pattern with spatial superposition and to form the images of the particular grating pattern and the second grating pattern with spatial superposition, and wherein said position detecting means includes photoelectric converting means for photoelectrically converting a first moire fringe provided by the images of the particular grating pattern and the first grating pattern and a second moire fringe provided by the images of the particular grating pattern and the second grating pattern, the first and second signals being formed on the basis of the photoelectric conversion by said photoelectric converting means.

10. A device according to claim 8 wherein the reference grating pattern comprises, as the one portion and the other portion thereof respectively, first and second grating patterns the images of which, when formed, have different spatial frequencies with respect to a predetermined direction, and wherein said image forming means is arranged to form the image of the particular grating pattern and the images of the first and second grating patterns at spatially different positions, and wherein said position detecting means includes photoelectric converting means for photoelectrically converting the images of the particular grating pattern and the first and second grating patterns, and signal processing means for producing the first signal on the basis of a video signal from said photoelectric converting means, corresponding to the images of the particular grating pattern and the first grating pattern, and to form the second signal on the basis of a video signal from said photoelectric converting means, corresponding to the images of the particular grating pattern and the second grating pattern.

11. A device according to claim 9, wherein the images of the first and second grating patterns have spatial frequencies of $F_0-F$ and $F_0+F$, respectively, where $F_0$ denotes the spatial frequency of the image of the particular grating pattern in the predetermined direction and F is the spatial frequency of the first and second moire fringes in the predetermined direction.

12. A device according to claim 10, wherein the images of the first and second grating patterns have spatial frequencies of $F-F_0$ and $F+F_0$, respectively, where F is the spatial frequency of the moire fringe in the predetermined direction and $F_0$ is the spatial frequency of the image of the particular grating pattern.

13. A device according to claim 8, wherein the particular grating pattern is formed on an object to be examined and wherein said device includes a movable stage on which the object can be placed.

14. A device according to claim 8, further comprising a movable stage on which an object having the reference grating pattern formed thereon can be placed.

15. A device according to claim 8, wherein said image forming means is arranged to detect the formed images in a dark field.

16. A position detecting method for detecting the relative position of a particular grating pattern with respect to a predetermined reference grating pattern, said method comprising:

a preparation step for preparing first and second grating patterns the images of which, when formed, have different spatial frequencies with respect to a predetermined direction, the first and second grating patterns functioning as the reference grating pattern;

a first signal forming step for forming a first signal corresponding to a first moire fringe provided or to be provided by images of the particular grating pattern and the first grating pattern, the first signal having a phase shiftable in a first direction in accordance with the position of the particular grating pattern;

a second signal forming step for forming a second signal corresponding to a second moire fringe provided or to be provided by images of the particular grating pattern and the second grating pattern, said second signal having a phase shiftable in a second direction opposite to the first direction in accordance with the position of the particular grating pattern; and a position detecting step for detecting the position of the particular pattern on the basis of any difference in phase between the first and second signals.

17. A method according to claim 16, wherein the first and second grating patterns are so prepared that their images, when formed, have spatial frequencies $F_0-F$ and $F_0+F$ where $F_0$ is the spatial frequency of the particular grating pattern and $F$ is the spatial frequency of the first and second moire fringes, in the predetermined direction.

18. A method according to claim 16, wherein the following relationship is satisfied:

$$L_W = \epsilon L_0 \ (0 < \epsilon < 0.5)$$

where $L_W$ is the grating pitch of the image of the particular grating pattern and $L_0$ is the pitch of the first and second moire fringes, in the predetermined direction.

19. A method according to claim 18, wherein the following relationship is satisfied:

$$(1-\epsilon)L_{R1} = (1+\epsilon)L_{R2}$$

where $L_{R1}$ and $L_{R2}$ are the grating pitches of the images of the first and second grating patterns, in respect to the predetermined direction.

20. A method according to claim 16, wherein the first signal forming step includes a first converting step for photoelectrically converting the first moire fringe, with the images being superposed one upon another, wherein the second signal forming step includes a second converting step for photoelectrically converting the second moire fringe, with the images being superposed one upon another, and wherein the first signal is formed in accordance with the first converting step while the second signal is formed in accordance with the second converting step.

21. A method according to claim 20, wherein the first signal forming step includes a first extraction step for extracting a signal of a frequency not greater than a predetermined frequency, out of a signal obtained at the first converting step, the first signal being formed with the intervention of the first extracting step, and wherein the second signal forming step includes a second extracting step for extracting a signal of a frequency not greater than the predetermined frequency, out of a signal obtained at the second converting step, the second signal being formed with the intervention of the second extracting step.

22. A method according to claim 16, wherein the first signal forming step includes a first producing step for mutually multiplying signals obtained by photoelectric conversion of the images of the particular grating pattern and the first grating pattern to produce a predetermined signal, wherein the second signal forming step includes a second producing step for mutually multiplying signals obtained by photoelectric conversion of the images of the particular grating pattern and the second grating pattern to produce a predetermined signal, and wherein the first signal is formed in accordance with the first producing step and the second signal is formed in accordance with the second producing step.

23. A method according to claim 22, wherein the first signal forming step includes a first extracting step for extracting a signal of a frequency not greater than a predetermined frequency, out of the signal obtained at the first producing step, the first signal being formed with the intervention of the first extracting step, and wherein the second signal forming step includes a second extracting step for extracting a signal of a frequency not greater than the predetermined frequency, out of the signal obtained at the second producing step, the second signal being formed with the intervention of the second extracting step.

24. An exposure apparatus for aligning a wafer with respect to said apparatus by use of a grating mark formed on said wafer and a predetermined reference grating pattern formed at a location relative to said apparatus, and for exposing the wafer with a radiation beam to print a predetermined pattern on the wafer, said apparatus comprising:

means for directing a radiation beam to the wafer;

a stage for supporting the wafer and being movable relatively to said beam directing means;

driving means for relatively moving said beam directing means and said stage;

image pickup means for forming images of the grating mark and the reference grating pattern; and control means responsive to an output signal from said image pickup means for forming a first signal by using the images of the grating mark and one portion of the reference grating pattern and corresponding to a first moire fringe provided by or to be provided by these images, and forming a second signal by using the images of the grating mark and another portion of the reference grating pattern and corresponding to a second moire fringe provided by or to be provided by the images, the first and second signals having phases shiftable in opposite directions in accordance with the positional relationship between the grating mark and the reference grating pattern; said control means detecting any difference in phase between the first and the second signals, and controlling said driving means on the basis of the detected difference in phase between the first and second signals.

25. An apparatus according to claim 24, wherein said image pickup means forms the images of the grating mark and the reference grating pattern at spatially different positions and produces signals corresponding to the formed images, and wherein said control means operates to produce the first and second signals by mutual multiplication of the signals produced by the image pickup means corresponding to the formed images.

26. An apparatus according to claim 25, wherein said image pickup means forms the images of the grating mark and first and second grating patterns, which are the one portion and the other portion of the reference grating pattern respectively, and images of which have different spatial frequencies in respect to a predetermined direction, and wherein said control means operates to form the first signal by extracting a signal of a frequency not greater than a predetermined frequency, out of the signal formed by multiplication of a signal corresponding to the image of the grating mark with a signal corresponding to the image of the first grating pattern, and also to form the second signal by extracting a signal of a frequency not greater than the predetermined frequency, out of the signal formed by multiplication of a signal corresponding to the image of the grating mark with a signal corresponding to the image of the second grating pattern.

27. An apparatus according to claim 26, wherein said image pickup means forms the images of the grating mark and the first and second grating patterns, so that the image of the grating mark has a spatial frequency $F_0$, the moire fringe has a spatial frequency F and the images of the first and second grating patterns have spatial frequencies of $F_0-F$ and $F_0+F$, respectively.

28. An apparatus according to claim 27, wherein said beam directing means includes supporting means for supporting a mask having a circuit pattern and the first and second grating patterns formed thereon, and wherein said beam directing means directs a radiation beam to the wafer in accordance with the circuit pattern, to thereby print the circuit pattern on the wafer.

29. An apparatus according to claim 27, wherein said beam directing means includes supporting means for supporting a mask having a circuit pattern formed thereon, and a projection optical system for projecting an image of the circuit pattern on the wafer and for directing a radiation beam to the wafer in accordance with the circuit pattern to print the circuit pattern on the wafer.

30. An apparatus according to claim 29, further comprising a mark plate mounted with said apparatus and having the first and second grating patterns formed thereon, wherein said mark plate is provided at a position which is optically conjugate with the wafer with respect to said projection optical system.

31. An apparatus according to claim 30, wherein the mask is provided with a grating-like mask mark, other than the circuit pattern, wherein said image pickup means forms an image of the grating-like mask mark, wherein said control means operates to extract a signal of a frequency not greater than a predetermined frequency, out of a signal formed by multiplication of a signal corresponding to the image of the grating-like mask mark with a signal corresponding to the image of the first grating pattern, to produce a third signal having a phase shiftable in accordance with the position of the mask wherein said control means operates to extract a signal of a frequency not greater than the predetermined frequency, out of a signal formed by multiplication of a signal corresponding to the image of the grating-like mask mark with a signal corresponding to the image of the second grating pattern, to produce a fourth signal having a phase shiftable oppositely to the shift of the third signal, in accordance with the position of the mask, and wherein said control means operates to adjust the position of said supporting means in accordance with any difference in phase between the third and fourth signals, at align the mask with respect to said apparatus.

32. An apparatus according to claim 27, wherein said stage is movable and said driving means is operable to move said stage, and wherein said control means operates to control said driving means to adjust the position of said stage to align the wafer with respect to the apparatus.

33. An apparatus according to claim 24, wherein said image pickup means forms the images of the grating mark and the reference grating pattern with superposition and produces a particular signal, and wherein the first and second signals are formed on the basis of the particular signal.

34. An apparatus according to claim 33, wherein said image pickup means forms the images of the grating mark and first and second grating portions, which are the one portion and the other portion of the reference grating pattern respectively, and images of which have different spatial frequencies in respect to a predetermined direction, and wherein said control means operates to form the first signal by extracting a signal of a frequency not greater than a predetermined frequency, out of a signal obtained on the basis of superposition of the images of the grating mark and the first grating pattern, and to form the second signal by extracting a signal of a frequency not greater than the predetermined frequency, out of a signal obtained on the basis of superposition of the images of the grating mark and the second grating pattern.

35. An apparatus according to claim 34, wherein said image pickup means forms the images of the grating mark and the first and second grating patterns, so that the image of the grating mark has a spatial frequency $F_0$, the moire fringe has a spatial frequency F and the images of the first and second grating patterns have spatial frequencies of $F_0-F$ and $F_0+F$, respectively.

36. An apparatus according to claim 24, wherein said image pickup means forms the images of the reference grating pattern and first and second grating marks which serve as the grating mark and images of which have different spatial frequencies in respect to a predetermined direction, and wherein said control means operates to form the first signal corresponding to a moire fringe provided by or to be provided by the images of the first grating mark and the reference grating pattern, and also to form the second signal corresponding to a moire fringe provided by or to be provided by the images of the second grating mark and the grating pattern.

37. An apparatus according to claim 36, wherein said image pickup means forms the images of the reference grating pattern and the first and second grating marks so that the image of the reference grating pattern has a spatial frequency of $F_0$, the moire fringe has a spatial frequency F and the images of the first and second grating marks have spatial frequencies of $F_0-F$ and $F_0+F$, respectively, in said predetermined direction.

38. A method of aligning first and second objects, comprising:
  a mark preparation step for providing the first object with first and second grating marks the images of which, when formed, have different spatial frequencies with respect to a predetermined direction;

a pattern preparation step for providing the second object with a grating pattern the image of which, when formed, has a spatial frequency different from those of the first and second grating marks with respect to said predetermined direction;

a signal formation step for forming images of the first and second grating marks and the grating pattern, and for forming a first signal corresponding to a moire fringe provided or to be provided by the images of the first grating mark and the grating pattern, and a second signal corresponding to a moire fringe provided or to be provided by the images of the second grating mark and the grating pattern;

wherein the resultant first and second signals having phases shiftable in opposite directions in accordance with a positional deviation between the first and second objects; and an alignment step for aligning the first and second objects on the basis of any difference in phase between the first and second signals.

39. A method according to claim 38, wherein, with respect to the predetermined direction, the image of the grating pattern has a spatial frequency of $F_0$, the moire fringes have a spatial frequency of F and the images of the first and second grating marks have spatial frequencies of $F_0-F$ and $F_0+F$, respectively.

40. A method according to claim 39, wherein $L_W = \epsilon L_0$ ($0 < \epsilon < 0.5$) is satisfied when, with respect to the predetermined direction, each moire fringe has a pitch $L_0$ and the image of the grating pattern has a grating pitch $L_W$, and wherein $(1-\epsilon)L_{R1} = (1+\epsilon)L_{R2}$ is satisfied when the images of the first and second grating marks have grating pitch of $L_{R1}$ and $L_{R2}$, respectively.

41. A method, usable with a first object having a first grating pattern and a second object having a second grating pattern, for detecting the position of the second object with respect to the first object, said method comprising the steps of:

forming a first signal corresponding to a moire fringe, provided by the first and second grating patterns, and having a phase changeable in a direction in response to the position of the second object;

forming a second signal corresponding to a moire fringe, provided by the first and second grating patterns, and having a phase changeable in an opposite manner to be first signal in response to the position of the second object; and determining the position of the second object on the basis of the difference in phase between the first and second signals.

42. A method according to claim 41, wherein the first grating pattern has a pair of portions having different spatial frequencies, and wherein said first signal forming step comprises the step of forming the first signal by using an image of one of the paired portions of the first grating pattern and an image of the second grating pattern, and wherein said second signal forming step comprises the step of forming the second signal by using an image of the other portion of the first grating pattern and an image of the second grating pattern.

43. A method according to claim 42, further comprising the step of independently detecting each of: the image of the one of the paired portions of the first grating pattern, the image of the other of the paired portions of the first grating pattern, and the image of the second grating pattern, independently of the others.

44. A method according to claim 43, wherein said first signal forming step comprises the step of forming the first signal by detecting a moire fringe produced by superposing the image on one of the paired portions of the first grating pattern and the image of the second grating pattern one upon another, and wherein said second signal forming step comprises the step of forming the second signal by detecting a moire fringe produced by superposing the image of the other of the paired portions of the first grating pattern and the image of the second grating pattern one upon another.

45. In a semiconductor device manufacturing method usable with a substrate having a first grating pattern and a wafer having a second grating pattern, in which the position of the wafer with respect to the substrate is detected and, after adjustment of the position of the wafer on the basis of the detection, a circuit pattern is printed on the wafer, the improvement comprising the steps of:

forming a first signal corresponding to a moire fringe, provided by the first and second grating patterns, and having a phase changeable in a direction in response to the position of the wafer;

forming a second signal corresponding to a moire fringe, provided by the first and second grating patterns, and having a phase changeable in an opposite manner to the first signal in response to the position of the wafer; and determining the position of the wafer on the basis of the difference in phase between the first and second signals.

46. In a semiconductor device manufacturing method usable with a mask having a circuit pattern and a wafer with respect to the mask is detected and, after adjustment of the position of the wafer on the basis of the detection, the circuit pattern of the mask is printed on the wafer, the improvements comprising the steps of:

providing first and second grating patterns of different spatial frequencies on the mask;

forming a first signal corresponding to a moire fringe, provided by the first grating pattern and the grating mark, and having a phase changeable in a direction in response to the position of the wafer;

forming a second signal corresponding to a moire fringe, provided by the second grating pattern and the grating mark, and having a phase changeable in an opposite manner to the first signal in response to the position of the wafer;

determining the position of the wafer on the basis of the difference in phase between the first and second signals; and adjusting the position of the wafer on the basis of the determination in said determining step.

47. A method according to claim 46, wherein further comprising the step of independently detecting each of the image of the first grating pattern, the image of the second grating pattern, and the image of the grating mark, independently of the others.

48. A method according to claim 46, wherein said first signal forming step comprises the step of forming the first signal by detecting a moire fringe produced by superposing the image of the first grating pattern and the image of the grating mark one upon another, and wherein said second signal forming step comprises the step of forming the second signal by detecting a moire fringe produced by superposing the image of the second grating pattern and the image of the grating mark one upon another.

49. In a semiconductor device manufacturing method usable with a mask having a circuit pattern and a wafer having a grating mark, in which the position of the wafer is detected and, after adjustment of the position of the wafer on the basis of the detection, the circuit pattern of the mask is printed on the wafer, the improvements comprising in the steps of:

providing a reference plate having first and second grating patterns of different spatial frequencies;

forming a first signal corresponding to a moire fringe, provided by the first grating pattern and the grating mark, and having a phase changeable in a direction in response to the position of the wafer;

forming a second signal corresponding to a moire fringe, provided by the second grating pattern and the grating mark, and having a phase changeable in an opposite manner to the first signal in response to the position of the wafer;

determining the position of the wafer with respect to the reference plate on the basis of the difference in phase between the first and second signals; and adjusting the position of the wafer on the basis of the determination in said determining step.

50. A method according to claim 49, further comprising the step of independently determining each of the image of the first grating pattern, the image of the second grating pattern, and the image of the grating mark, independently of the others.

51. A method according to claim 49, wherein said first signal forming step comprises the step of forming the first signal by detecting a moire fringe produced by superposing the image of the first grating pattern and the image of the grating mark one upon another, and wherein said second signal forming step comprises the step of forming the second signal by detecting a moire fringe produced by superposing the image of the second grating pattern and the image of the grating mark one upon another.

* * * * *

UNITED STATES PATENT AND TRADEMARK OFFICE
CERTIFICATE OF CORRECTION

PATENT NO. : 5,189,494

DATED : February 23, 1993

INVENTOR(S) : MURAKI

It is certified that error appears in the above-identified patent and that said Letters Patent is hereby corrected as shown below:

TITLE PAGE

[76] Inventor:

Change address to read --Yokohama-shi, Kanagawa-ken, Japan--.

Between [76] and [21]

Insert: --[73] Assignee: Canon Kabushiki Kaisha, Tokyo, Japan--.

[56] References Cited

Insert after "Primary Examiner - F.L. Evans": --Attorney, Agent, or Firm: Fitzpatrick, Cella, Harper & Scinto--.

COLUMN 2

Line 23, "pattern, device" should read --pattern, the device--.

COLUMN 3

Line 24, "predetermined, frequency" should read --predetermined frequency,--.

COLUMN 8

Line 30, "cf" should read --of--.

UNITED STATES PATENT AND TRADEMARK OFFICE
CERTIFICATE OF CORRECTION

PATENT NO. : 5,189,494

DATED : February 23, 1993

INVENTOR(S) : MURAKI

It is certified that error appears in the above-identified patent and that said Letters Patent is hereby corrected as shown below:

COLUMN 9

Line 44, "$a_2 b_w \cos[mp(1/\ )w_o - R/L_w - S/L_w]+$" should read --$a_2 b_w \cos[mp(1/2)w_o - R/L_w - S/L_w]+$--.

COLUMN 11

Line 14, "$\Delta 1 - \Delta 2 = 2\Delta S/L_w + \Delta R(-1/L_1 + 1-L_w + 1/L_w - 1/L_2)$" should read
--$\Delta 1 - \Delta 2 = 2\Delta S/L_w + \Delta R(-1/L_1 + 1/L_w + 1/L_w - 1/L_2)$--.

COLUMN 15

Line 4, "$F_{0-f}$ and" should read --$F_0-F$ and--.
Line 5, "FO+F," should read --$F_0+F$,--.
Line 28, "$\beta_w \cdot L_0$, by" should read --$\beta_w \cdot L_0$,--.
Line 31, "$\beta_w L_2 = \beta_R (1-\epsilon) L_{R1} = \beta_R (1+\epsilon) L_{R2} = \epsilon \cdot \beta_w \cdot L_0$" should read
--$\beta_w \cdot L_w = \beta_R (1-\epsilon) L_{R1} = \beta_R (1+\epsilon) L_{R2} = \epsilon \cdot \beta_w \cdot L_0$--.
Line 41, "$\epsilon_w = (\epsilon L_m 2M)/L_w$" should read --$\beta_w = (\epsilon \cdot L_m \cdot 2M) L_w$--.

COLUMN 16

Line 24, "claim 8" should read --claim 8,--.

COLUMN 19

Line 63, "frequency ," should read --frequency,--.

UNITED STATES PATENT AND TRADEMARK OFFICE
CERTIFICATE OF CORRECTION

PATENT NO. : 5,189,494

DATED : February 23, 1993

INVENTOR(S) : MURAKI

It is certified that error appears in the above-identified patent and that said Letters Patent is hereby corrected as shown below:

COLUMN 20

Line 4, "at" should read --to--.
Line 20, "portions," should read --patterns,--.

COLUMN 22

Line 4, "on" should read --of the--.
Line 33, "wafer" should read --wafer having a grating mark, in which the position of the wafer--.

Signed and Sealed this

Fourteenth Day of December, 1993

Attest:

BRUCE LEHMAN

Attesting Officer      Commissioner of Patents and Trademarks